United States Patent [19]

Palkuti

[11] Patent Number: 4,816,753
[45] Date of Patent: Mar. 28, 1989

[54] METHOD FOR RELIABILITY TESTING OF INTEGRATED CIRCUITS

[75] Inventor: Leslie J. Palkuti, Sunnyvale, Calif.

[73] Assignee: Advanced Research and Applications Corporation, Sunnyvale, Calif.

[21] Appl. No.: 53,104

[22] Filed: May 21, 1987

[51] Int. Cl.$^4$ .............................................. G01R 31/26
[52] U.S. Cl. ............................ 324/158 R; 250/492.2; 324/158 T
[58] Field of Search ....................... 324/158 R, 158 T; 250/492.2

[56] References Cited

U.S. PATENT DOCUMENTS

| | | | |
|---|---|---|---|
| 3,796,955 | 3/1974 | Bhattacharyya et al. | 324/158 T |
| 3,889,188 | 6/1975 | Trindade | 324/158 T |
| 4,168,432 | 9/1979 | Williams et al. | 324/758 T X |
| 4,172,228 | 10/1979 | Gauthier et al. | 324/158 T X |
| 4,220,918 | 9/1980 | Pepper | 324/158 T |
| 4,575,676 | 3/1986 | Palkuti | 324/158 R |

OTHER PUBLICATIONS

Seehra et al., "The Effect of Operating Conditions On the Radiation Resistance of VDMOS Power FETs," IEEE Trans. Nuc. Sci, vol. 29, No. 6, Dec. 1982, pp. 1559–1563.

Volmerange et al., "Radiation Effects on MOS Power Transistors", IEEE Trans. Nuc. Sci., vol. 29, No. 6, Dec. 1982, pp. 1565–1568.

Palkuti, L. J., Ormond, R., "Automated Measurements of Wafer Spatial Variations in Die Radiation Response", 1986 GOMAC Digest of Papers, vol. XI (Nov. 1986).

Palkuti, L. J., and Truong, Q., "An X-ray Irradiation System for Total–Dose Testing of Quartz Resonators," 38th Annual Frequency Control Symposium, Philadelphia, PA (May 27–30, 1984).

Palkuti, L. J., "Comprehensive Radiation Testing of ICs at the Wafer Stage," SEMICON West. Technical Proceedings (May 1984).

Palkuti, L. J., "Automated Total–Dose and Dose-Rate Radiation Testing of ICs at the Wafer Stage," 1984 GOMAC Digest of Papers, vol. X (Nov. 1984).

Palkuti, L. J. and Pang, C. S., "Line-Source Processing of SOI Structures with Laser and Electron Beam," Mat. Res. Soc. Symp. Proc., vol. 33 (1984), Published by Elsevier Science Publishing Co., Inc.

Palkuti, L. J., et al., "The Influence of Surface Encapsulation on SOI Recrystallization," ECS Meeting, Montreal, Canada (1982).

Palkuti, L. J. and LePage, J. J., "X-ray Wafer Probe for Total–Dose Testing," IEEE Trans. on Nucl. Sci., NS 29:6 (Dec. 1982).

Chenming Hu, et al., "Hot–Electron–Induced MOSFET Degradation–Model, Monitor, and Improvement," IEEE Trans. on Electron Devices, vol. ED 32, No. 2, Feb. 1985.

Tam, Simon, et al., "Lucky-Electron Model of Channel Hot–Electron Injection in MOSFET's", IEEE Trans. on Electron Devices, vol. ED-31, No. 9, Sep. 1984.

Hui, J. et al., "A New Substrate and Gate Current Phenomenon in Short-Channel LDD and Minimum Overlap Devices", IEEE Electron Device Letters, vol. ED-L-6, No. 3, Mar. 1985.

Hui, J. and Moll, J., "Submicrometer Device Design for Hot–Electron Reliability and Performance," IEEE Electron Device Letters, vol., EDL-6, No. 7, Jul. 1985.

(List continued on next page.)

Primary Examiner—Jerry Smith
Assistant Examiner—Stephen M. Baker
Attorney, Agent, or Firm—Thomas Schneck

[57] ABSTRACT

A method for reliability testing of wafer stage integrated circuit devices wherein a hardness factor is established relating device substrate currents to device lifetimes attributable to interface trap degradation. A beam of ionizing radiation is then directed onto the device until a critical dose is reached, at which time the device fails. The critical dose is plotted against hardness factors so that device lifetimes may be predicted.

8 Claims, 2 Drawing Sheets

OTHER PUBLICATIONS

Choi, J. Y. et al., "Effect of Oxide Field on Hot-Carrier-Induced Degradation of Metal-Oxide-Semiconductor Field-Effect Transistors," Appl. Phys. Lett., Apr. 27, 1897.

"Evaluation of Hot Carrier Degradation of N-Channel MOSFET's with the Charge Pumping Technique", P. Heremans, H. E. Maes and N. Saks; *IEEE Electron Device Letters*, vol. EDL-7, No. 7, Jul. 1986, pp. 238-240.

"Two-Dimensional Modeling of Channel Hot-Electron Effects in Silicon MOSFETS", C. L. Wilson and T. J. Russell; Semiconductor Electronics Division, National Bureau of Standards, Gaithersburg, MD 20899, IEDM pp. 72-75.

"Measurement of Radiation-Induced Interface Traps Using MOSFETs"; M. Gaitan and T. J. Russell; *IEEE Transactions on Nuclear Science*, vol. NS-31, No. 6, Dec. 1984, pp. 1256-1260; Semiconductor Devices and Circuits Division, National Bureau of Standards, Washington, D.C. 20234.

"A Simple Model for Separating Interface and Oxide Charge Effects in MOS Device Characteristics"; K. F. Galloway, M. Gaitan and T. J. Russell; *IEEE Transactions on Nuclear Science*, vol. NS-31, No. 6, Dec. 1984, pp. 1497-1501.

METHOD FOR RELIABILITY TESTING OF INTEGRATED CIRCUITS

DESCRIPTION

1. Technical Field

The invention relates to destructive testing of integrated circuits for interface trap degradation, also known as hot-carrier degradation, in order to predict device lifetime.

2. Background Art

In U.S. Pat. No. 4,575,676, L. Palkuti disclosed a test apparatus for electron devices, such as integrated circuits. The apparatus included a beam of ionizing radiation, such as an X-ray beam, combined with an electrical probe card contacting a test device or integrated circuit. The radiation source generated hole-electron pairs within the passivation regions of the device which lead to trapped charges and interface states which change the device's electrical characteristics. The apparatus was intended to measure the radiation performance of test devices and circuits.

Modern integrated circuits with small dimensions are subject to degradation of their electrical characteristics by "hot carriers" generated by high local electric fields. These hot carriers produced are the hole electrons that give rise to interface-state degradation and reduce the lifetime of integrated circuits. In reliability testing of integrated circuits, the prior art test procedure for measuring interface trap degradation calls for operation of a device for many hours or days to measure a lifetime as a function of device dimensions, bias parameters and fabrication methods. Such reliability testing is very expensive because of the time involved waiting for a failure to occur.

An object of the invention was to devise a rapid method for reliability testing of defects in devices related to interface trap degradation in integrated circuits.

SUMMARY OF INVENTION

The above object has been achieved with a new test method involving stimulation of large numbers of hole-electron pairs in device oxide layers which become bound in interface traps, leading to device failure in relatively short times.

The test method involves a calibration sequence whereby a device is electrically aged to failure from interface trap degradation by a specified electrical test procedure to measure device lifetime. The devices are MOSFETs which are portions of very large scale integration devices on a silicon wafer. A measurement of substrate current and device lifetimes is done for MOSFETs made by different processes and having different dimensions, particularly different width dimensions. Device lifetime is plotted against substrate current for the different devices so that interface-trap degradation hardness factor, H, is established.

Once device hardness factor, H, is known, a test sequence is employed. Interface-trap degradation is simulated by directing a beam of ionizing radiation onto an integrated circuit device within a wafer with sufficient beam energy to generate ionization induced electron-hole pairs in oxide layers of a MOSFET. The radiation dose is increased until a critical dose is reached where the number of interface traps causes the MOSFET to become inoperable. By relating the critical radiation dose to the hardness factor, it is possible to predict device lifetimes.

Since a critical radiation dose may be reached in a few minutes, the present test method allows device lifetimes to be determined in much shorter times than previously possible. Radiation induced degradation of devices simulates "hot-electron" induced degradation except that the testing time to determine device lifetime is compressed.

BEST MODE FOR CARRYING OUT THE INVENTION

In prior U.S. Pat. No. 4,575,676, mentioned above, there is a description of an apparatus suitable for carrying out the method of the present invention. While this apparatus is not the only one possible, it is particularly useful for providing variable radiation doses to an integrated circuit at the wafer stage of fabrication.

Figure 1:
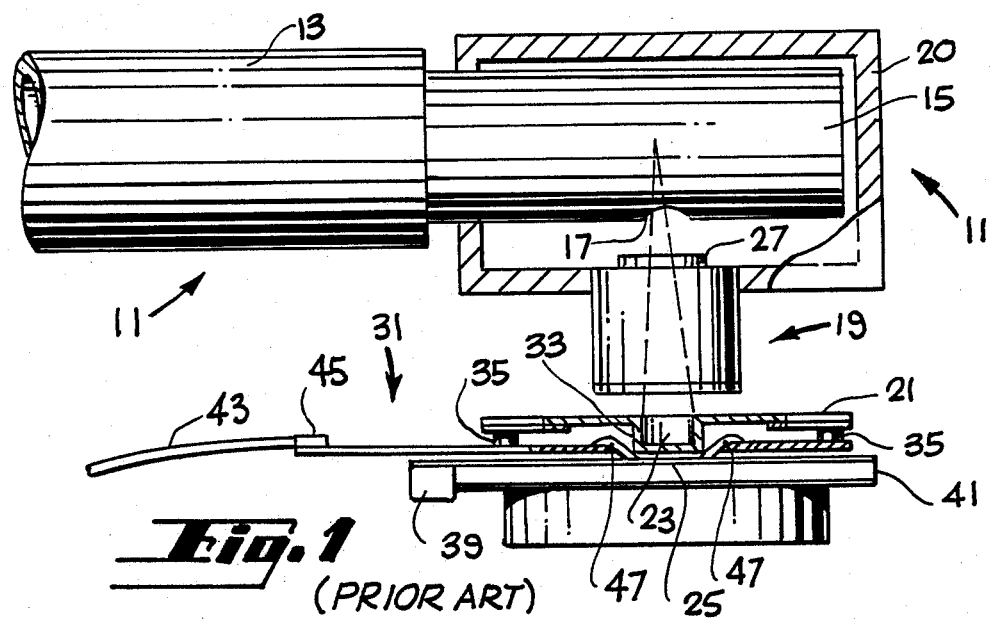
FIG. 1 is a partial cutaway view of a source of ionizing radiation over an electrical test fixture and target electron device for testing in accord with the method of the present invention.

With reference to FIG. 1, an X-ray tube assembly 11 is seen having a tube base 13 enclosing a filament, and a tube anode assembly 15 enclosing a target. Anode assembly 15 has a window 17 through which X-rays pass into a collimator 19. Anode assembly 15 is enclosed in a radiation blocking housing 20. The only exit for radiation is through an aperture with shutter 27 that can be opened and closed to either pass or cut off the radiation beam. Tube 11 could be another source of radiation, such as a laser light source or isotopic radiation source. Collimator 19 includes materials selected to minimize scattering of radiation and maximize beam collimation.

Electrical testing is carried out by means of a probe card 31 modified for X-ray testing by means of an auxiliary collimator 33 mounted on an auxiliary shield 21 by means of spacers 35. The probe card is used to provide mechanical support for auxiliary shield 21, in turn supporting auxiliary collimator 33. Auxiliary shield 21 is typically a metallic planar member supported about one to two centimeters above probe card 31 in a parallel plane. Auxiliary collimator 33 is generally tubular, having a centrally defined port 23 receiving a radiation beam from collimator 19 and delivering it to an electron device such as an integrated circuit on a wafer 25 immediately below the lower exit aperture of the port. The beam port or aperture through the center of the auxiliary collimator limits the beam cross sectional area to an area corresponding to an electronic device to be irradiated. The wafer 25 is supported on a chuck 41 having a dosimeter 39 on its periphery. Dosimeter 39 is preferably a solid-state detector, such as a PIN diode, giving an instantaneous read out of radiation flux in the path of the beam. Such placement is possible because the chuck 41 is movable in the X-Y plane.

Probe card 31 receives power for a cable 43 connected to card 31 by means of a cable terminator 45 which matches power and signal wires in the cable to printed wires on the card 31. In turn, these printed wires lead toward a central aperture in the card 31 where wire probes 47 make electrical contact with wafer 25 through a central aperture in the card 31.

The position of wafer 25 may be shifted by lowering wafer chuck 41 then translating it in the X and Y direction. The shutter is closed during wafer translation such that unselected devices are not irradiated. One instance in which such translation must occur is for use of dosimeter 39. In order to check the radiation flux, wafer chuck 41 is lowered and dosimeter 39 is moved so that it is directly in line with the radiation beam emerging from window 17. Once calibration or radiation flux measurements are complete, the chuck 41 is translated so that a desired integrated circuit can be exposed by the beam.

Figure 2:
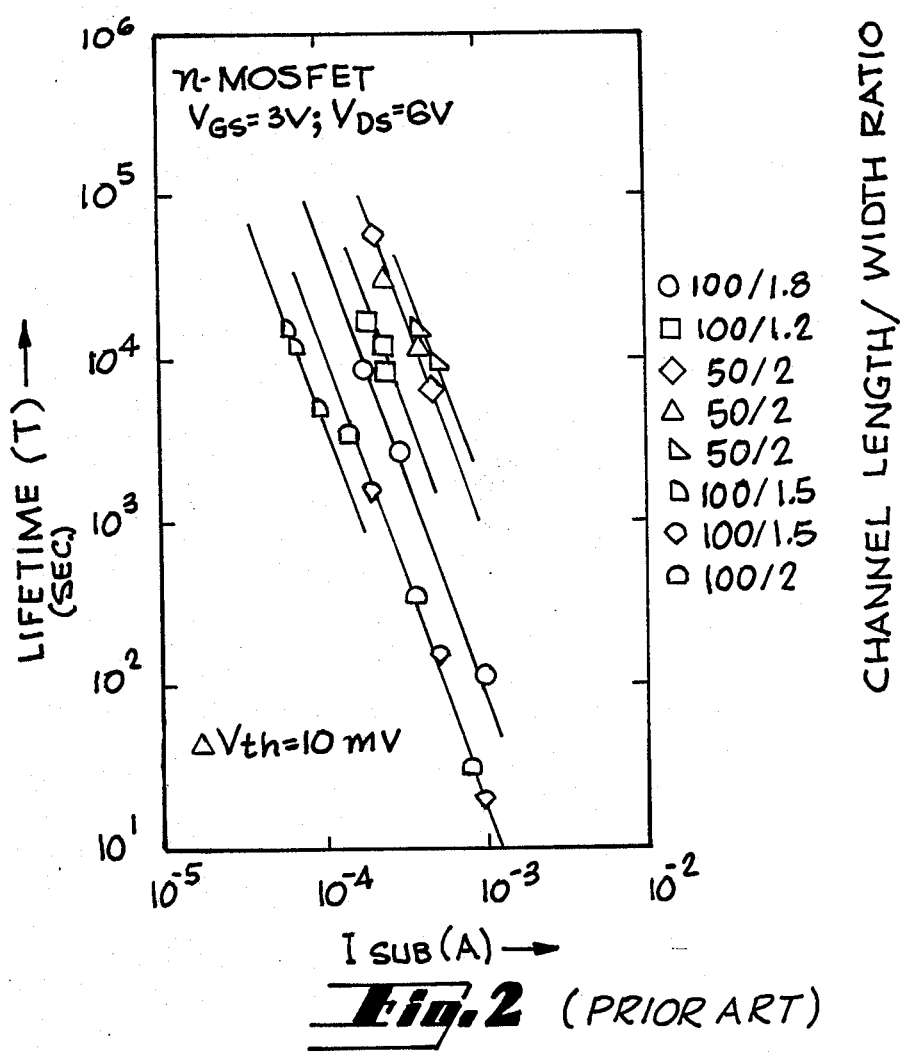
FIG. 2 is a calibration plot of device lifetime versus substrate current for devices manufactured using different processes and device dimensions.

With reference to FIG. 2, a plot is seen of various n-channel MOSFET devices with device lifetime plotted against substrate current. The different MOSFET devices have different length to width ratios for their channels, as indicated at the right of the plot. The devices have been aged in the usual way until failure occurs due to interface trap degradation. There is a power-law relationship, with a negative slope, between device lifetime and substrate current. The gate to source bias voltage is 3 volts and the drain to source bias is 6 volts. Device lifetime was defined at the point when the device threshold voltage, $V_{th}$ increased by 10 millivolts.

It is known that device lifetime scales with the substrate current as follows:

$$\tau = H(I_{sub}/W)^{-3} \tag{1}$$

where W is the device width and $I_{sub}$ is the substrate current due to hole generation (assuming an n-channel MOSFET) near the drain by impact ionizations. $I_{sub}$ is a convenient monitor of the electron temperature or the hot carrier density. H represents the hardness of the oxide and the interface against hot-carrier damage, mainly interface trap generation. H is termed a "hardness factor".

FIG. 1 shows that for a given $I_{sub}$, the device lifetimes, $\tau$, and hence the hardness factor, H, varied by nearly two-orders of magnitude among devices fabricated in different laboratories and using different technologies. By measuring the device lifetime and normalizing the results by the substrate current, a calibration procedure is defined to measure the hardness factor, H, as follows:

$$H = \tau(I_{sub}/W) \tag{2}$$

Once the calibration procedure described above is complete, the present invention contemplates utilizing the apparatus of FIG. 1, or a similar apparatus, to apply a dose of ionizing radiation to an integrated circuit at the wafer stage and utilize this procedure to measure H and thus simulate the normal aging process, except that aging and failure occur much faster. The integrated circuit must contain a MOSFET for measurement purposes. The ionizing radiation will produce electron-hole pairs which will migrate into interface traps causing device failure. The radiation dose required to reach this point is proportional to the hardness factor as follows:

$$D_{crit} = \alpha H \tag{3}$$

where $D_{crit}$ is the measured critical radiation dose, that produces the same number of interface traps as produced in the calibration procedure.

Equation 3 implies that there is a universal relationship between $D_{crit}$, i.e. the critical radiation dose, and H, the hot-carrier hardness factor. By measuring different devices, this universal relationship can be established as suggested by FIG. 3. The devices represented by FIG. 3 were manufactured by different processes, having different oxide thickness and so on utilizing the same lifetime criteria. Different lifetime criteria, such as changes in device transconductance, could result in different slopes.

Figure 3:
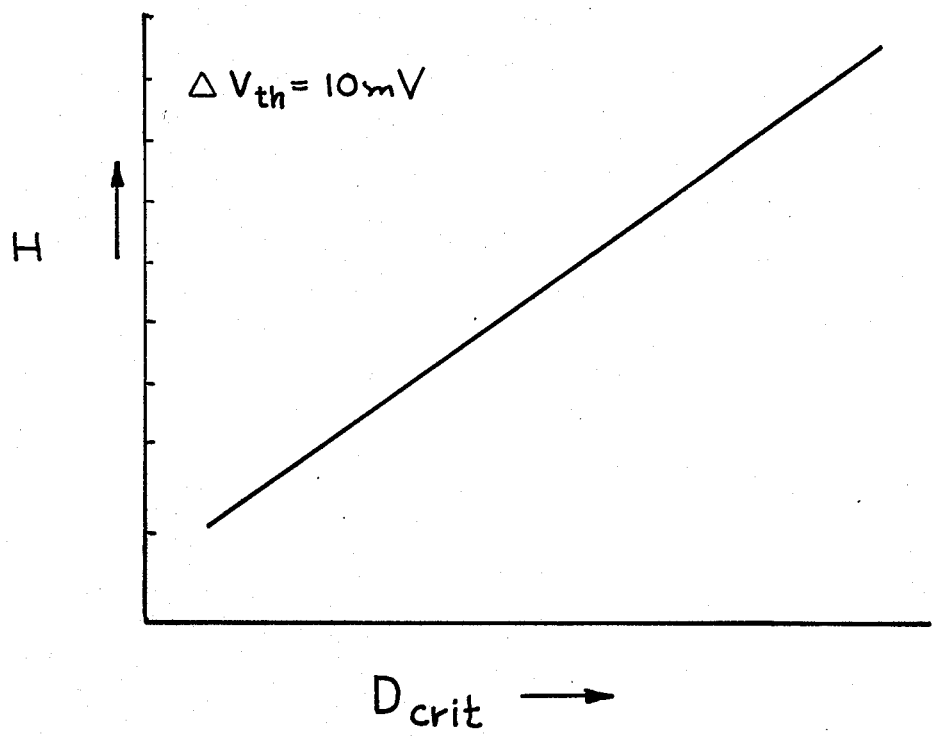
FIG. 3 is the universal plot of hardness factor, H, versus critical radiation dose, $D_{crit}$ for a specific voltage threshold criterion for device lifetime.

Once a plot in accord with FIG. 3 is established for a specified device lifetime may be predicted by knowing $D_{crit}$. Using a measured value of $D_{crit}$ the corresponding value of H on the ordinate of the plot in FIG. 3 yields a device lifetime in accord with equation (2) assuming device width and substrate current are either known or have been measured. $I_{sub}$ is easily measured in a MOSFET device using the apparatus of FIG. 1.

If the radiation test is performed on complete VLSI devices, $I_{sub}$ of course cannot be measured. $I_{sub}$ is then calculated using the following model:

$$I_{sub} = 2 \times I_d e^{-1.7 \times 10^6/E_m} \tag{4}$$

where the exponential dependence of the maximum channel field, $E_m$, results from the exponential dependence of the impact ionization coefficient on 1/E. I is the drain current which can be determined from circuit analysis. The maximum channel field is estimated utilizing the following relations between electrical and device junction parameters:

$$E_m = (V_d - V_{dsat})/0.2\, X_{ox}^{1/3}\, X_j^{\frac{1}{2}} \tag{5}$$

$$V_{dsat} = \frac{(V_g - V_t)\, L\, E_{sat}}{V_g - V_t + L\, E_{sat}} \tag{6}$$

where $V_{dsat}$ is the drain saturation voltage, L is the channel length, $E_{sat} \sim 5 \times 10^4$ V/cm is the electric field for velocity saturation, $X_{ox}$ ox and $X_j$ are the oxide thickness and the drain junction depth. In addition to the dependence equations (4), (5) and (6) these relations include the dependences of $I_{sub}$ on L, $X_{ox}$ on $V_d$ and $V_g$, and $X_j$. These device parameters are determined from process monitor measurements.

The present invention satisfactorily predicts integrated circuit device lifetimes based upon radiation induced failure due to electron-hole pair interface trap degradation.

I claim:

1. A method for reliability testing of wafer stage integrated circuits comprising,
  (a) electrically aging wafer stage integrated circuits each having at least one MOSFET, different MOSFETs having different dimensions, the aging involving empirically measuring a radiation hardness factor, H, where H is a known function of device lifetime, device current and device dimensions, until failure of said MOSFET,
  (b) simulating the aging of wafer stage integrated circuits each having at least one MOSFET by applying a dose of ionizing radiation sufficient to cause interface trap degradation failure,
  (c) correlating the ionizing radiation dose causing device failure to the hardness factor H and predicting device lifetime.

2. The method of claim 1 wherein said dose of ionizing radiation is applied by an X-ray beam.

3. The method of claim 1 wherein said dose of ionizing radiation is applied by an isotopic radiation source.

4. The method of claim 1 wherein said hardness factor is defined by the equation $$H = \tau \cdot (I_{sub}/W)$$

where W is device width, $I_{sub}$ is substrate current in a test device and $\tau$ is device lifetime.

5. A method for reliability testing of wafer stage integrated circuits comprising, (a) measuring substrate currents and lifetimes attributable to interface trap degradation in MOSFETs each having a gate, source, drain, at least one MOSFET being part of an integrated circuit on a wafer, different MOSFETs being made by different processes and having different dimensions, including a width dimension, (b) relating device substrate currents to device lifetimes attributable to interface trap degradation for devices of different widths and establishing device hardness factors, H, which are functions of substrate current, width and device lifetimes, (c) directing a beam of ionizing radiation onto an integrated circuit device within a wafer, the device having a MOSFET with at least one oxide layer, the beam having sufficient energy to generate ionization induced electron-hole pairs in said oxide layer, (d) measuring a critical radiation dose $D_{crit}$, versus hardness factor, H, where $D_{crit}$ is the radiation dose producing a number of interface traps causing the MOSFET in said device to become inoperative, and (e) predicting device lifetime based upon values of $D_{crit}$.

6. The method of claim 5 wherein said dose of ionizing radiation is applied by an X-ray beam.

7. The method of claim 5 wherein said dose of ionizing radiation is applied by an isotopic radiation source.

8. The method of claim 5 wherein said hardness factor is given by the equation $$H = \tau \cdot (I_{sub}/W)^3$$

where W is device width, $I_{sub}$ is substrate current in a test device and $\tau$ is device lifetime.

* * * * *